United States Patent
Lim

(10) Patent No.: US 9,032,108 B2
(45) Date of Patent: May 12, 2015

(54) SEMICONDUCTOR DEVICE AND METHOD OF OPERATING THE SAME

(71) Applicant: SK Hynix Inc., Gyeonggi-do (KR)

(72) Inventor: Sang Oh Lim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 37 days.

(21) Appl. No.: 14/071,184

(22) Filed: Nov. 4, 2013

(65) Prior Publication Data

US 2014/0344505 A1   Nov. 20, 2014

(30) Foreign Application Priority Data

May 14, 2013  (KR) .................. 10-2013-0054351

(51) Int. Cl.
*G06F 13/00* (2006.01)
*G06F 12/02* (2006.01)
*G06F 12/08* (2006.01)
*G11C 8/00* (2006.01)

(52) U.S. Cl.
CPC ............ *G06F 12/0246* (2013.01); *G06F 12/08* (2013.01)

(58) Field of Classification Search
CPC ........... G06F 13/00; G06F 12/00; G06F 3/00; G11C 8/00
USPC ..................... 710/8–10; 711/170; 365/233.14
See application file for complete search history.

(56) References Cited

U.S. PATENT DOCUMENTS

| | | | | |
|---|---|---|---|---|
| 4,179,738 | A | * | 12/1979 | Fairchild et al. ............... 712/205 |
| 5,764,076 | A | * | 6/1998 | Lee et al. ......................... 326/38 |
| 5,771,242 | A | * | 6/1998 | Adams et al. .................. 714/738 |
| 5,790,564 | A | * | 8/1998 | Adams et al. .................. 714/738 |
| 5,796,745 | A | * | 8/1998 | Adams et al. .................. 714/718 |
| 6,222,757 | B1 | * | 4/2001 | Rau et al. ....................... 365/154 |
| 6,501,677 | B1 | * | 12/2002 | Rau et al. ....................... 365/154 |
| 6,542,434 | B1 | * | 4/2003 | Monzel ....................... 365/233.1 |
| 6,714,450 | B2 | * | 3/2004 | Bertrand et al. .......... 365/185.08 |
| 2007/0030732 | A1 | * | 2/2007 | Micheloni et al. ........ 365/185.03 |
| 2007/0074070 | A1 | * | 3/2007 | Lakhani et al. .................... 714/8 |
| 2012/0239900 | A1 | * | 9/2012 | Nautiyal et al. ............... 711/170 |

FOREIGN PATENT DOCUMENTS

KR   1020060054572   5/2006

* cited by examiner

*Primary Examiner* — Christopher Shin
(74) *Attorney, Agent, or Firm* — IP & T Group LLP

(57) ABSTRACT

A semiconductor device includes a memory block including memory cells coupled to bit lines, read/write circuits each including cache latch suitable for temporarily storing data to be stored in the memory cells, wherein the read/write circuits are divided into a plurality of groups and perform a program operation to store the data in the memory cells coupled to the bit lines, and an initialization control unit suitable for initializing the cache latches of the read/write circuits of a group corresponding to the address before the data is input to the cache latches, when a program command and an address are input.

20 Claims, 8 Drawing Sheets

SEMICONDUCTOR DEVICE AND METHOD OF OPERATING THE SAME

CROSS-REFERENCE TO RELATED APPLICATION

The present application claims priority to Korean patent application number 10-2013-0054351 filed on May 14, 2013 in the Korean Intellectual Property Office, the entire disclosure of which is incorporated herein by reference in its entirety.

BACKGROUND

1. Technical Field

Various embodiments relate to an integrated circuit design technology, and more particularly, to a semiconductor device including a control circuit and a method of operating the same.

2. Related Art

After data input from an external device are temporarily stored in latches of read/write circuits (e.g., page buffers) within a memory device, a program operation may be performed to store the data in memory cells.

When data having fewer bits than the number of latches is input, the data may not be input to some of the latches. The latches to which the data is not input are to be initialized to a program-inhibited state.

When a large number of latches are initialized at the same time, current consumption may surge instantaneously. That is, a peak current (i.e., a power drop) may occur. As a result, the electrical characteristics of the memory device may be deteriorated, and an erroneous operation may occur.

BRIEF SUMMARY

Various embodiments are directed to a semiconductor device that may relieve a peak current when a large number of latches are initialized to a program-inhibited state, and method of operating the same.

A semiconductor device according to an embodiment of the present invention may include memory cells coupled to bit lines, read/write circuits each including cache latch suitable for temporarily storing data to be stored in the memory cells, wherein the read/write circuits are divided into a plurality of groups and perform a program operation to store the data in the memory cells coupled to the bit lines, and an initialization control unit suitable for initializing the cache latches of the read/write circuits of a group corresponding to the address before the data is input to the cache latches, when a program command and an address are input.

A method of operating a semiconductor device according to an embodiment of the present invention may include initializing cache latches of read/write circuits of a group corresponding to the address, when a program command and an address are input, inputting data to the initialized cache latches, initializing remaining cache latches, which are not initialized, when a program confirmation command is input, and performing a program operation to store the data in memory cells.

DETAILED DESCRIPTION

Figure 1:
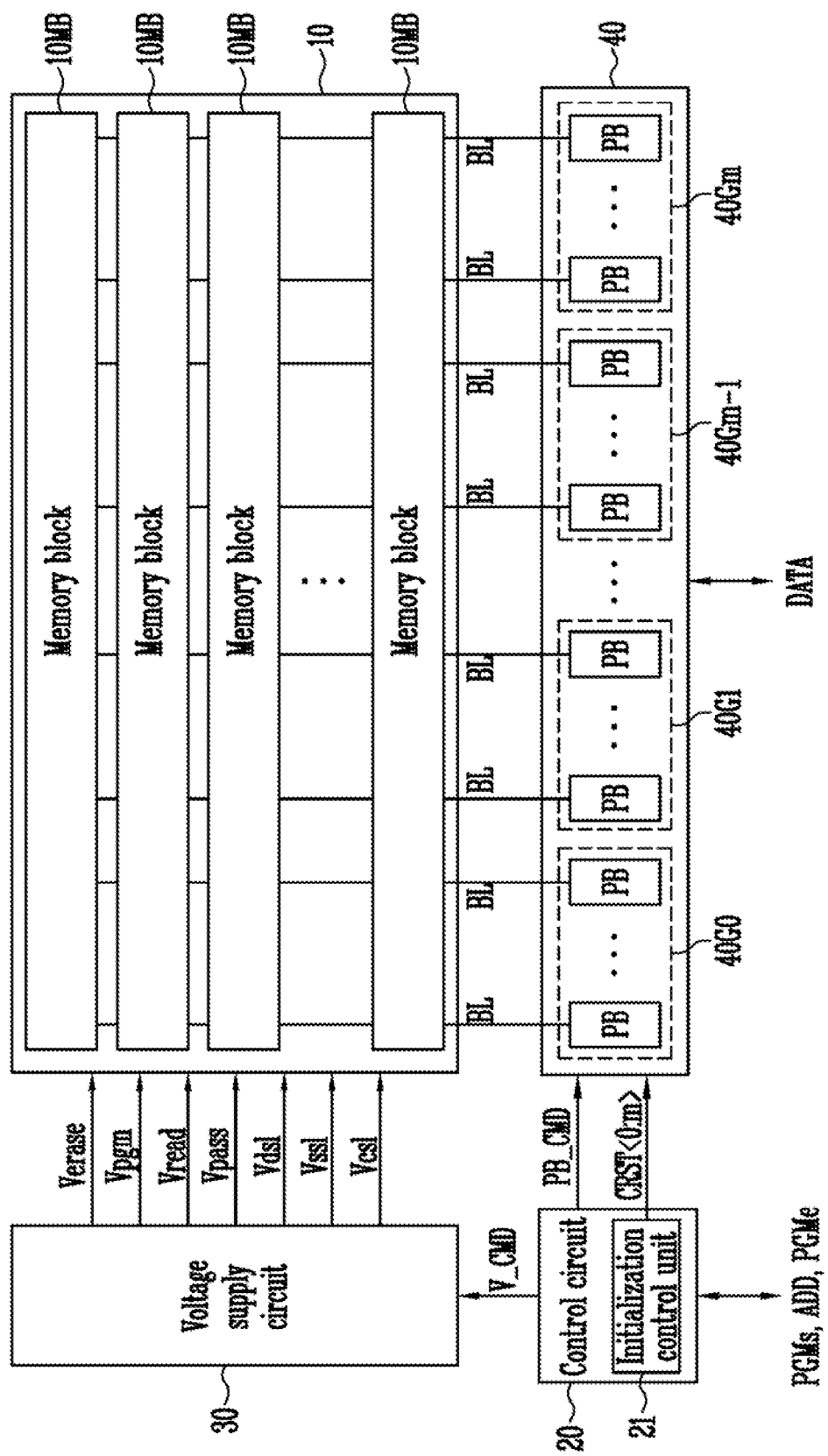
FIG. 1 is a block diagram illustrating a semiconductor device according to an embodiment of the present invention.

Hereinafter, various embodiments will be described in detail with reference to the accompanying drawings. The figures are provided to allow those having ordinary skill in the art to understand the scope of the embodiments of the disclosure. The present invention may, however, be embodied in different forms and should not be construed as limited to the embodiments set forth herein. Rather, these embodiments are provided so that this disclosure be thorough and complete, and will fully convey the scope of the present invention to those skilled in the art. Throughout the disclosure, reference numerals correspond directly to the like numbered parts in the various figures and embodiments of the present invention.

Furthermore 'connected/coupled' represents that one component is directly coupled to another component or indirectly coupled through another component. In this specification, a singular form may include a plural form as long as it is not specifically mentioned in a sentence. Furthermore, 'include/comprise' or 'including/comprising' used in the specification represents that one or more components, steps, operations, and elements exists or are added.

FIG. 1 is a block diagram illustrating a semiconductor device according to an embodiment of the present invention.

Referring to FIG. 1, the semiconductor device may include a memory array 10 and peripheral circuits 20 to 40. The peripheral' circuits may include a control circuit 20 and operation circuits 30 and 40.

The memory array 10 may include a plurality of memory blocks 10MBs. A structure of the respective memory block 10 MB is described below.

Figure 2:
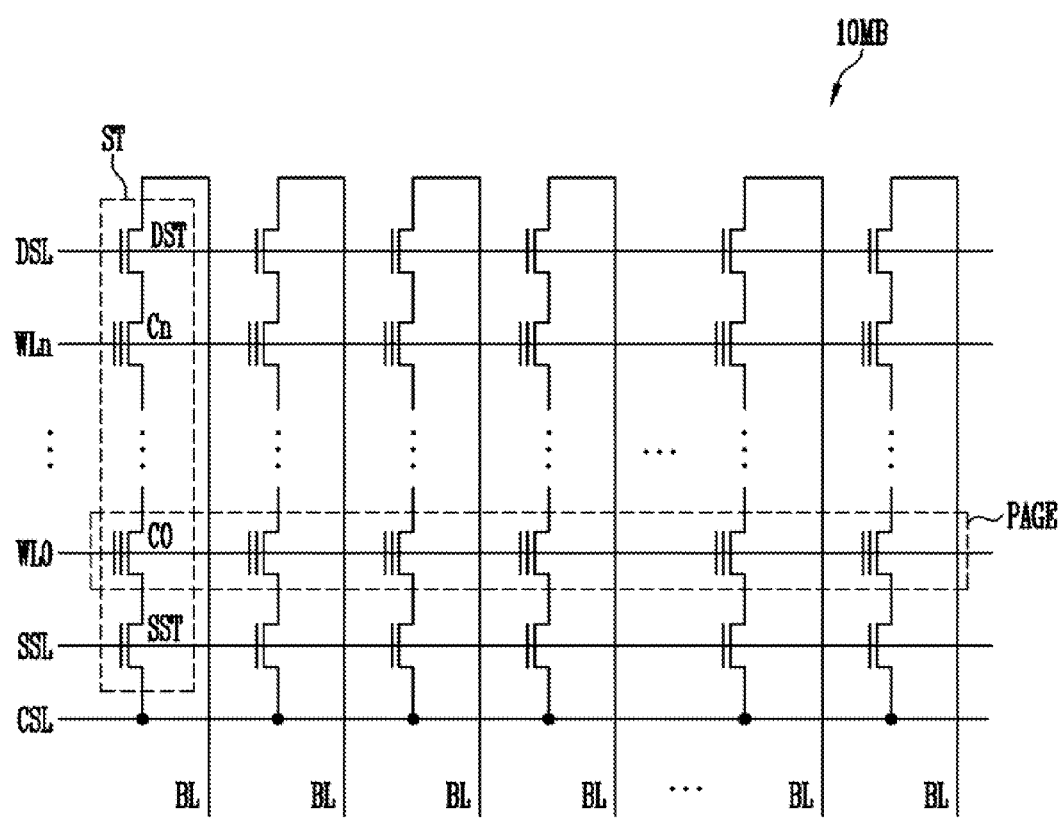
FIG. 2 is a detailed diagram illustrating a memory block shown in FIG. 1.

FIG. 2 is a detailed diagram illustrating the respective memory block 10 MB shown in FIG. 1.

Referring to FIG. 2, each memory block 10 MB may include a plurality of memory strings STs that are coupled between respective bit lines BLs and a common source line CSL. In other words, each memory string ST may be coupled to each of the bit lines BLs corresponding thereto, and the memory strings STs may be coupled in common to the common source line CSL. Each of the memory strings STs may include a source selection transistor SST, a cell string, and a drain selection transistor DST. A source of the source selection transistor SST may be coupled to the common source line CSL. The cell string may include a plurality of memory cells C0 to Cn coupled in series with each other. A drain of the drain selection transistor DST may be coupled to the bit line BL.

The memory cells C0 to Cn included in the cell string may be coupled in series between the selection transistors SST and DST. A gate of the source selection transistor SST may be coupled to a source selection line SSL. Gates of the memory cells C0 to Cn may be coupled to word lines WL0 to WLn, respectively. A gate of the drain selection transistor DST may be coupled to the drain selection line DSL.

The drain selection transistor DST may control coupling and decoupling of the cell strings and the bit line BL. The source selection transistor SST may control coupling and decoupling of the cell strings and the common source line CSL.

In a NAND flash memory device, memory cells, included in a memory block 10MB, may be divided into unit of physical page or unit of logical page. For example, the memory cells coupled to a single word line (e.g., WL0), may form a single physical page PAGE. Meanwhile even numbered memory cells and odd-numbered memory cells that are coupled to the single word line (e.g., WL0) may form an even logical page and an odd logical page, respectively. Such page (or even page and odd page) may be a basic unit for a program operation or a read operation.

Referring again to FIG. 1, the peripheral circuits 20 to 40 may perform a program loop, an erase loop and a read operation on memory cells coupled to a selected word line (e.g., WL0). The peripheral circuits may include the control circuit 20 and the operation circuits 30 to 40. The control circuit 20 may control the program loop, the erase loop and the read operation. The, operation circuits 30 to 40 may perform the program loop, the erase loop, and the read operation under control of the control circuit 20. In order to perform the program loop, the erase loop and the read operation, the operation circuits 30 to may selectively output operating voltages Verase, Vpgm, Vread, Vpass, Vdsl, Vssl and Vcsl to the common source line CSL and local lines SSL, WL) to WLn and DSL of a selected memory block. In addition, the operation circuits 30 and 40 may control precharge and discharge operations of the bit lines BLs or sense the current flow of the bit lines BLs.

In the NAND flash memory device, the operation circuits may include a voltage supply circuit 30 and a data input/output circuit 40.

The control circuit 20 may output a voltage control signal V_CMD to control the voltage supply circuit 30. The operating voltages Verase, Vpgm, Vread, Vpass, Vdsl, Vssl and Vcsl that are applied to perform the program loop, the erase loop, and the read operation may be generated at predetermined levels in response to command signals PGMs and PGMe from an external device. The control circuit 20 may output a page buffer control signal PB_CMD for controlling read/write circuits (e.g., page buffers) PBs included in the data input/output circuit 40 to perform a program loop, an erase loop, and a read operation. In addition, when an address ADD is input, the control circuit 20 may generate a column address signal and a row address signal by using the address ADD. A word line selected by a row address may be determined, and operating voltages applied to the selected word line and unselected word lines may be changed.

For example, the control circuit 20 may further include an initialization control unit 21 to control initialization of a latch (e.g., a cache latch) included in the read/write circuit PB.

The voltage supply circuit 30 may generate the operating voltages Verase, Vpgm, Vread, Vpass, Vdsl, Vssl, and Vcsl applied to perform a program loop, an erase loop, and a read operation on memory cells in response to the voltage control signal V_CMD of the control circuit 20. The voltage supply circuit 30 may output the operating voltages to the local lines SSL, WL0 to WLn and DSL and the common source line CSL of the selected memory block in response to the row address signal of the control circuit 20.

The voltage supply circuit 30 may include a voltage generator (not illustrated) and a row decoder (not illustrated). The voltage generator may generate the operating voltages Verase, Vpgm, Vread, Vpass, Vdsl, Vssl, and Vcsl in response to the voltage control signal V_CMD of the control circuit 20. The row decoder may transfer the operating, voltages to the local lines SSL, WL0 to WLn and DSL and the common source line CSL of the selected memory block among the memory blocks 10MBs in response to the row address signal of the control circuit 20.

As described above, the voltage supply circuit 30 may output and change the operating voltages Verase, Vpgm, Vread, Vpass, Vdsl, Vssl, and Vcsl in response to the voltage control signal V_CMD of the control circuit 20.

The data input/output circuit 40 may include a plurality of read/write circuits PBs that are coupled to the memory array 10 through the bit lines BLs. The read/write circuits PBs may be divided into a plurality of groups 40G0 to 40Gm. In other words, the data input/output circuit 40 may include the read/write circuit groups 40G0 to 40Gm. The read/write circuits PBs may selectively precharge the bit lines BLs in response to the control signal PB_CMD of the control circuit 20 and data DATA to be stored in the memory cells during a program operation. During a program verification operation or a read operation, the read/write circuits PBs may precharge the bit lines BLs and subsequently latch data read from the memory cells by sensing a voltage variation or a current of the bit lines BLs in response to the control signal PB_CMD of the control circuit 20.

Each of the read/write circuits PBs may be coupled to each of the bit lines or to each pair of adjacent bit lines. A configuration in which each of the read/write circuits PBs is coupled to each pair of adjacent bit lines is described below.

Figure 3:
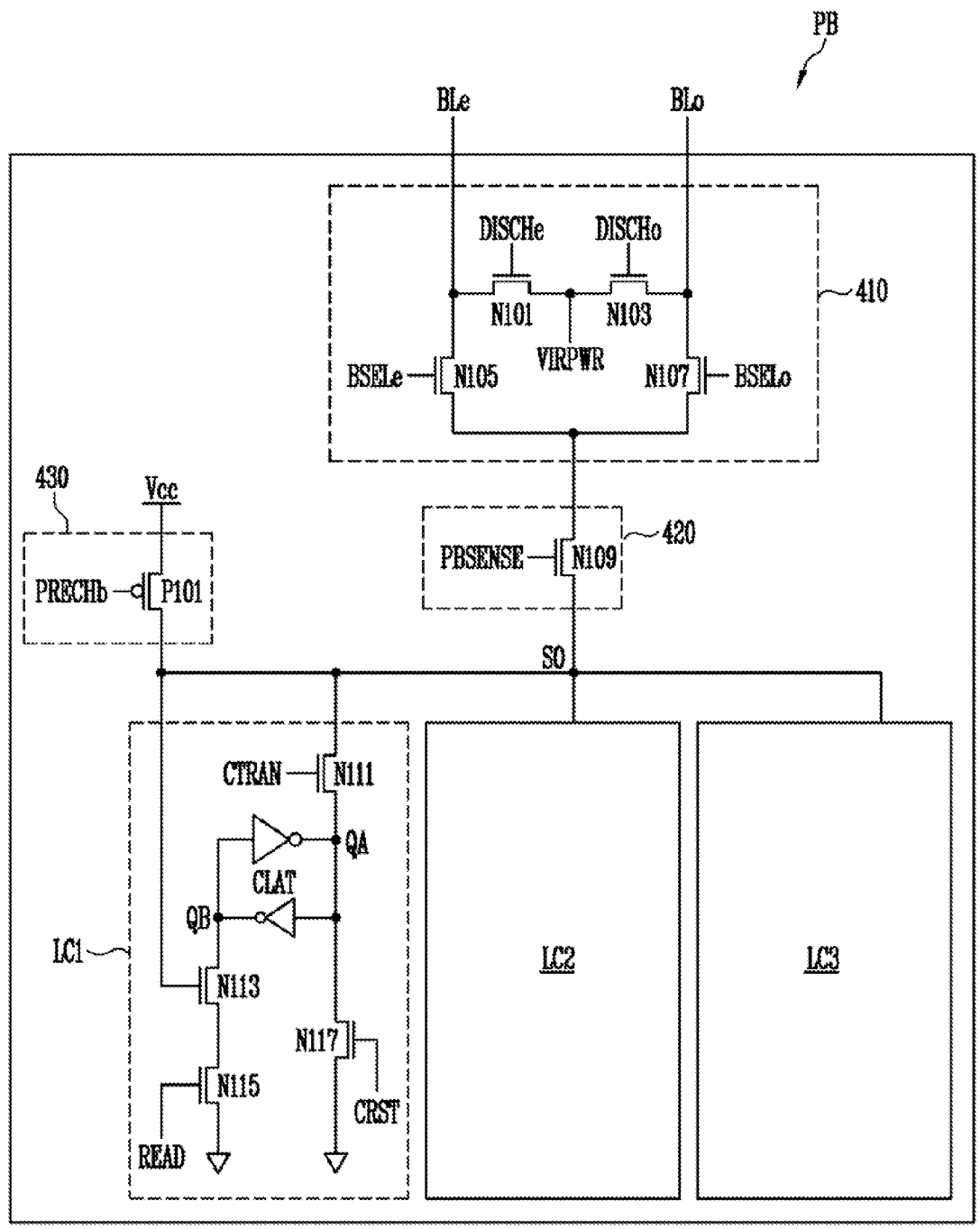
FIG. 3 is a detailed diagram of a read/write circuit of FIG. 1.

FIG. 3 is a detailed diagram of one of the read/write circuits shown in FIG. 1.

Referring to FIG. 3, the read/write circuit PB may operate in response to the control signal PB_CMD of the control circuit of FIG. 1. The control signal PB_CMD may include signals PRECHb, TRAN, RST, SET, PBSENSE, BLSe, BLSo, DISCHe and DISCHo, which are to be described below.

The read/write circuit PB may include a bit line selection circuit 410, a bit line coupling circuit 420, a precharge circuit 430, and first to third latch circuits LC1 to LC3.

Switching devices N105 and N107 of the bit line selection circuit 410 may select an even bit line BLe or an odd bit line BLo in response to bit line selection signals BSELe and BSELo, respectively. Switching devices N101 and N103 may selectively discharge precharged bit lines in response to discharge signals DISCHe and DISCHo, respectively. The bit line selection circuit 410 may be needed when a bit line pair consisting of an even bit line and an odd bit line is coupled to a single page buffer. In other words, the bit line selection circuit 410 may be removed in case of an all bit line (ABL) method in which a single page buffer is coupled to a single bit line.

The bit line coupling circuit 420 may couple a bit line, selected by the bit line selection circuit 410, to one of the latch circuits LC1 to LC3 in response to a coupling signal PBSENSE. The bit line coupling circuits 420 may include a switching device N109 that operates in response to the coupling signal PBSENSE. The latch circuits LC1 to LC3 may be coupled in parallel with the switching device N109. The bit line coupling circuits 420 and the latch circuits LC1 to LC3 may be connected to a sensing node SO.

The precharge circuit 430 may include a switching device P101, which is coupled between a power voltage terminal Vcc and the sensing node SO and operates in response to a precharge signal PRECHb. The precharge circuit 430 may precharge the sensing node SO. A voltage Vcc, precharged to the sensing node SO, may be used as a precharge voltage for precharging a bit line. In other words, the precharge circuit 430 may generate the precharge voltage for precharging a bit line.

The number of latch circuits may vary for different design needs. In FIG. 3, three latch circuits LC1 to LC3 are shown for illustrative purposes. In general, only one of the latch circuits LC1 to LC3 may be activated. The first latch circuit LC1 may function as a cache latch circuit. The cache latch circuit temporarily stores externally input data and transfers the data to another latch circuit (LC2 or LC3) for a program operation, or temporarily stores data read from a memory cell during a read operation to output the data to an external device. The second latch circuit LC2 may apply a program-inhibit voltage or a program enable voltage to a bit line based on the data transferred from the first latch circuit LC1 during the program operation. In addition, the second latch circuit LC2 may temporarily store data stored in a selected memory cell and transfer the data to the first latch circuit LC1 based on a voltage of a bit line and transfer the cell data to the first latch circuit LC1 during a read operation. Further, the third latch circuit LC3 may latch a result of comparison between a threshold voltage of the selected memory cell and a target voltage during a verification operation, which is subsequent to the program operation and output the latched signal corresponding to the result of the comparison.

Each of the latch circuits LC1 to LC3 may include a plurality of switching devices and a latch. The first latch circuit LC1 is described below as an example.

The first latch circuit LC1 may include a cache latch CLAT configured to latch data, a switching device N111. a switching device N113, a switching device N115, and a switching device N117. The switching device N111 may couple a non-inverting node QA of the cache latch CLAT to the sensing node SO in response to a transfer signal CTRAN. The switching device N113 may be coupled to an inverting node QB of the latch CLAT and operate in response to the voltage of the sensing node SO. The switching device N115 may be coupled between the switching device N113 and a ground terminal and operate in response to a read signal READ. The switching device N117 may be coupled between the non-inverting terminal QA of the latch CLAT and a ground terminal and operate in response to a cache reset signal CRST.

Since signals having different waveforms are applied to the other latch circuits LC2 and LC3, even when the latch circuits LC2 and LC3 have the same configuration as each other, either one of the latch circuits LC2 and LC3 may be activated or the latch circuits LC2 and LC3 may perform different functions.

Since data to be stored in memory cells is temporarily stored in the cache latch CLAT, the cache latch CLAT is to be initialized before the data is input to the cache latch CLAT. Through initialization, program-inhibit data (e.g., data of '1') may be stored in the cache latch CLAT, and a signal having a high level may be output to the non-inverting node QA. Data to be temporarily stored in the cache latch CLAT may be determined based on the input data. When the data is not input, the cache latch CLAT may keep storing the program-inhibit data. In addition, during a program operation, the signal having the high voltage level may be output to a selected bit line (BLe or BLo) through the switching devices N111, N109 and N105 (or N107) and the selected bit line (BLe or BLo) may be precharged. As a result, even when the program voltage is applied to the memory cell during the program operation, the memory cell coupled to the precharged bit line may not be programmed.

As described above, when the number of bits of input data is smaller than the number of read/write circuits PBs, there may be a read/write circuit to which data is not input, and the cache latch CLAT of the read/write circuit to which the data is not input is to be initialized. The cache latch CLAT may be initialized by the cache reset signal CRST.

In addition, it may not be easy to selectively reset the cache latches CLATs after the data is input since it may make the circuit complicated. Therefore, it may be preferred that the data is input after the cache latches CLATs are reset. However, when the cache latches CLATs of a large number of read/write circuits PBs are reset at the same time, current consumption may surge instantaneously (i.e., a peak current ay occur), and, consequently, errors may occur.

Figure 4:
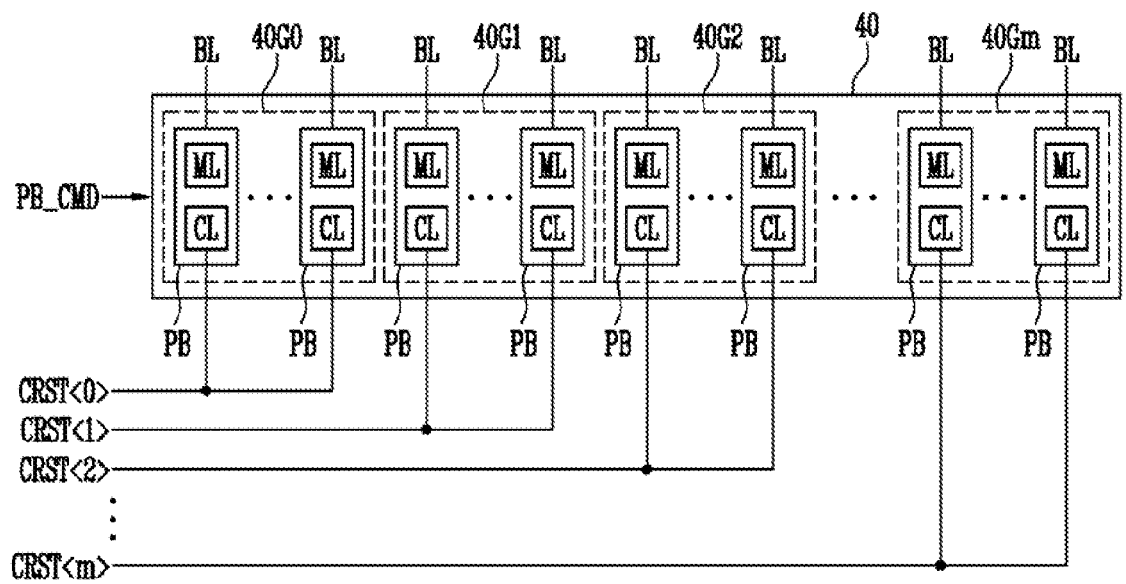
FIG. 4 is a detailed diagram of a data input/output circuit shown in FIG. 1.

FIG. 4 is a detailed diagram of a data input/output circuit 40 shown in FIG. 1.

Referring to FIG. 4, the read/write circuits PBs included in the data input/output circuit. 40 may be divided into groups 40G0 to 40Gm. The cache latches CLs of the read/write circuits PBs may be initialized by unit of group, Reference character 'ML' denotes a main latch that is included in the second or third latch circuit LC2 or LC3 of FIG. 3.

The cache reset signals CRST<0> to CRST<m> may be as many as the number of groups 40G0 to 40Gm. The cache reset signals CRST<0> to CRST<m> may be selectively output in response to an address. For example, when the cache reset signal CRST<0> is input, the cache latches CLs of the read/write circuits PBs included in the corresponding group 40G0 may be initialized at the same time. Since the cache latches CLs are reset by unit of group, the maximum current consumption may be reduced during each reset operation. However, when the read/write circuits PBs are divided into an excessively large number of groups, it may take too much time to reset all the cache latches CLs. In addition, when the read/write circuits PBs are divided into an excessively small number of groups, it may be difficult to sufficiently reduce the amount of current, which is consumed during a reset operation. Therefore, the number of read/write circuits PBs, included in each group, may be appropriately controlled.

Although the cache latches CLs of the read/write circuits PBs are initialized by unit of group, a sudden drop in a power voltage may occur during an initialization operation. However, a degree to which the power voltage is reduced may be relieved. Therefore, after the cache latches CLs of a selected group are initialized, the cache latches CLs of a next group may be initialized after an amount of time necessary to increase the power voltage to a target level passes.

As described above, the initialization control unit 21 may initialize the cache latches CLs may output the cache reset signals CRST<0> to CRST<m>.

Figure 5:
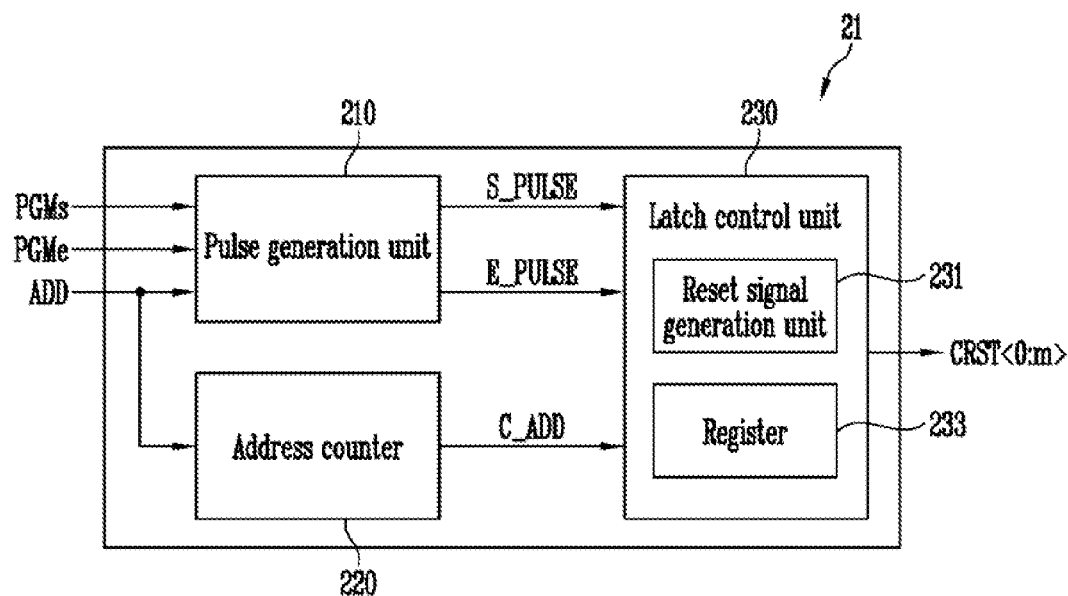
FIG. 5 is a detailed diagram of an initialization control unit shown in FIG. 1.

FIG. 5 is a detailed diagram of the initialization control unit 21 shown in FIG. 1.

Referring to FIG. 5, the initialization control unit 21 may include a pulse generation unit 210, an address counter 220, and a latch control unit 230. The latch control unit 230 may include a reset signal generation unit 231 and a register 233.

The pulse generation unit 210 may generate a start pulse S_PULSE when a program command PGMs and the address (e.g., column address) ADD are input and may generate an end pulse E_PULSE when a program confirmation command PGMe is input. The program confirmation command PGMe may be input after data to be stored in memory cells is temporarily stored in the read/write circuits PBs. The program confirmation command PGMe denotes that it is ready for a program operation.

The address counter 220 may increase the address while data is input to the read/write circuits PBs after the address ADD is input. In other words, the address counter 220 may output an address C_ADD that is increased.

The latch control unit 230 may output cache reset signals CRST<0:m> for initializing cache latches CLs of a selected group in response to the address C_ADD output from the address counter 220 when the start pulse S_PULSE is input. The latch control unit 230 may output the cache reset signals CRST<0:m> for initializing cache latches CLs, which are not initialized, when the end pulse E_PULSE is input.

More specifically, the reset signal generation unit 231 of the latch control unit 230 may output a cache reset signal (e.g. CRST<0>) to reset cache latches CLs of a group corresponding to the address C_ADD in response to the start pulse S_PULSE and the address C_ADD of the address counter 220. In addition, when a difference between the address of the next group of the read/write circuits and the address C_ADD is smaller than a predetermined value, the reset signal generation unit 231 of the initialization control unit 21 may output a cache reset signal (e.g., CRST<1>) to initialize the cache latches of the read/write circuits.

As described above, the reset signal generation unit 231 may keep outputting a cache reset signal as an address is counted. Since the first cache reset signal is to be output before initial data is input after input of the address is completed, a pulse width of the first cache reset signal ray be controlled so that the first cache reset signal may be output during a period of time between the input of the address and the input of the data. In addition, since a cache latch is to be reset before the data is input as described above, when the difference between the address of the next group and the address C_ADD is smaller than the predetermined value, a latch reset signal of the next group may be output beforehand.

Since the cache reset signals CRST<0:m> are output by the above-described method, a sufficient amount of time taken to output the cache reset signals CRST<0:m> may be ensured. In addition, even when the power voltage is instantaneously reduced by a reset operation, a cache reset signal of a next group may be output after the power voltage increases to a target level.

The register 233 may store a reset state of the corresponding group based on the cache reset signal.

When the end pulse E_PULSE is input, the reset signal generation unit 231 may sequentially or simultaneously output the remaining cache reset signals CRST<0:m> to initialize the cache latches CLs that are not initialized.

Figure 6:
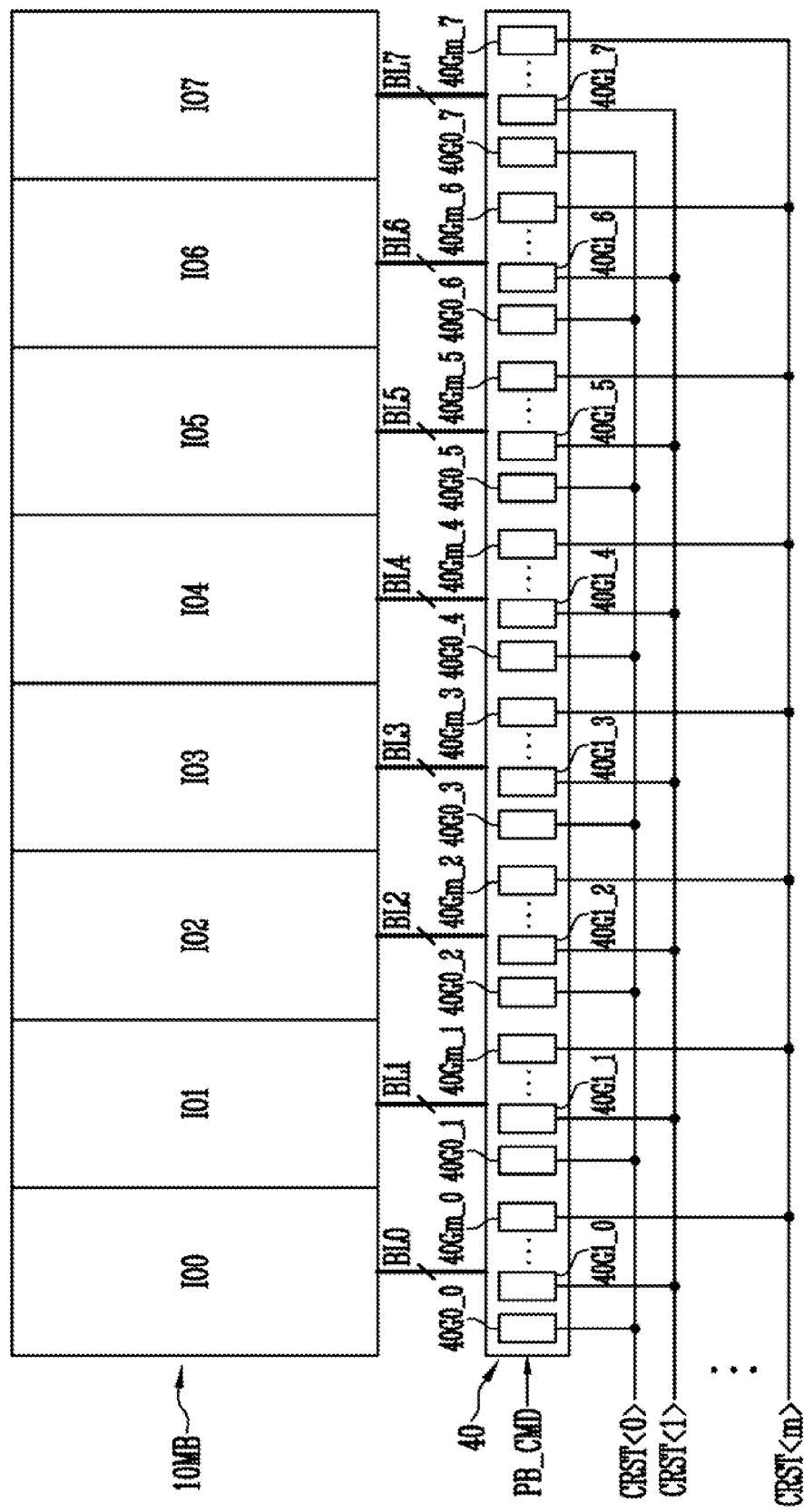
FIG. 6 is a block diagram illustrating a semiconductor device according to an embodiment of the present invention.

FIG. 6 is a block diagram illustrating a semiconductor device according to an embodiment of the present invention.

Referring to FIG. 6, each of the memory blocks may include a plurality of IO blocks I00 to IO7. The initialization control unit 21 may simultaneously initialize cache latches CLs of read/write circuits PBs of groups corresponding to an address in each IO block.

More specifically, for example, when first groups 40G0_0 to 40G0_7 are selected by JO blocks I00 to IO7 in response to an address, cache latches of the first groups 40G©_0 to 40G0_7 may be reset at the same time in response to the cache reset signal CRST<0>. To this end, the cache reset signals CRST<0:m> may be commonly input to the read/write circuits of the groups 40G0_0 to 40Gm_0, 40G0_1 to 40Gm_1, 40G0_2 to 40Gm_2, 40G0_3 to 40Gm_3, 40G0_4 to 40Gm_4, 40G0_5 to 40Gm_5, 40G0_6 to 40Gm_6 and 40G0_7 to 40Gm_7, included in the IO blocks IO0 to IO7, respectively. In other words, seven groups may be selected at the same time in the memory block 10MB, and the cache latches CLs included in the selected groups may be reset at the same time.

Figure 7:
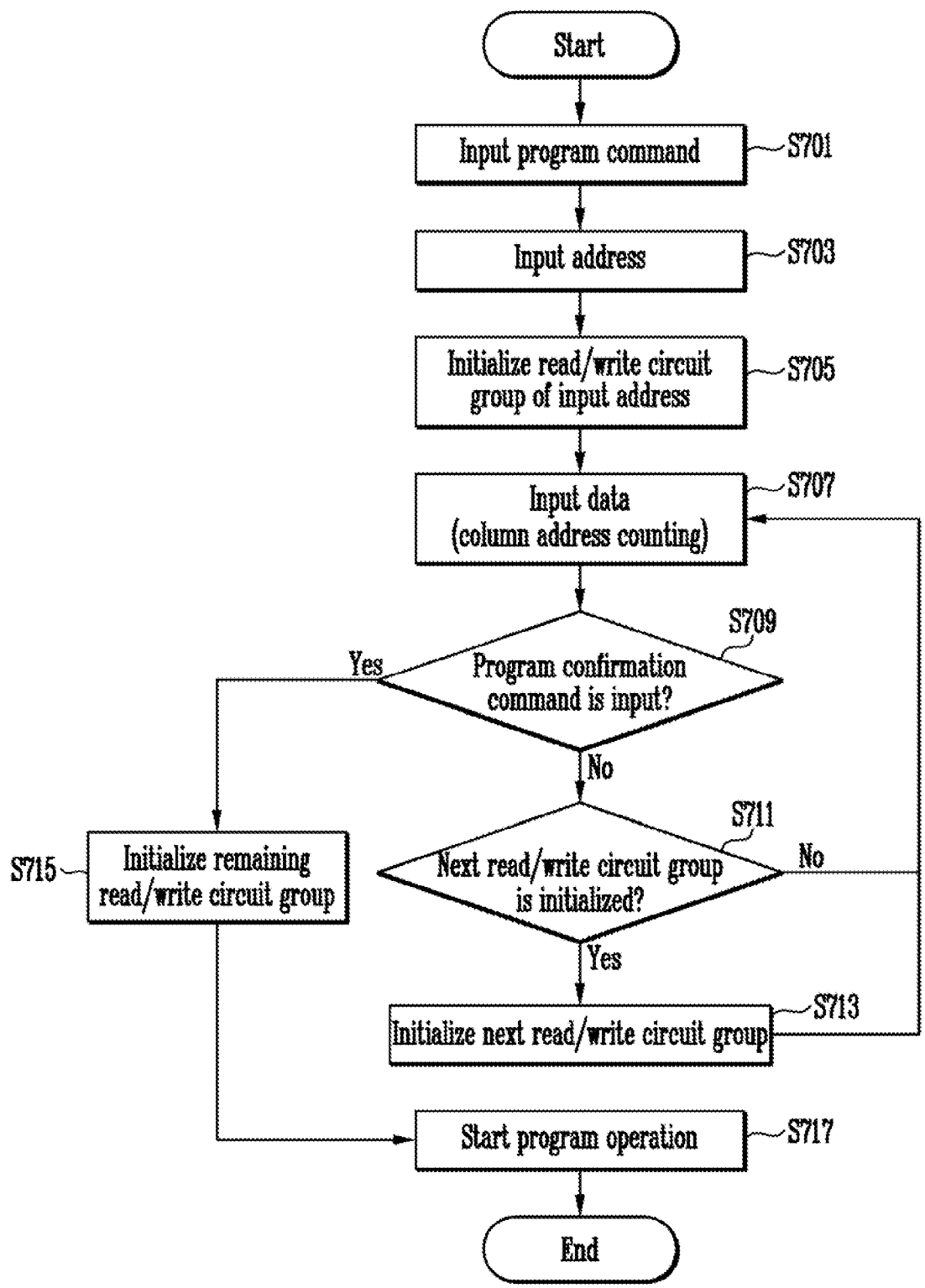
FIG. 7 is a flowchart illustrating operations of a semiconductor device according to an embodiment of the present invention.

FIG. 7 is a flowchart illustrating operations of a semiconductor device according to an embodiment of the present invention.

Referring to FIGS. 1 and 7, the program command PGMs may be input at step S701. Subsequently, the address ADD may be input at step S703. Memory cells may be selected to store data therein in response to the addresses ADD, which may include a plane address, a memory block address, a word line (or a page) address and a column address. In general, an address may be input for five cycles.

When the program command PGMs and the addresses ADD are input, the initialization control unit 21 may output a cache reset signal (e.g., CRST<0>) to reset cache latches of a read/write circuit group (e.g., 40G0) corresponding to the address ADD before the data DATA is input at step S705. Cache latches of the read/write circuit group (e.g., 40G0) may be reset in response to the cache reset signal (e.g., CRST<0>). Subsequently, after the cache latches of the read/write circuit group (e.g., 40G0) are reset in response to the cache reset signal (e.g., CRST<0>), the data DATA may start to be input to the cache latches of the reset read/write circuit group (e.g., 40G0) at step S707. The input data DATA may be temporarily stored in the reset cache latches. While the data DATA is being input to the cache latches of the read/write circuit group (e.g., 40G0), the initialization control unit 21 may increase the address ADD. The initialization control unit 21 may increase the address ADD while the data DATA is input. For example, the address may be increased by one bit each time one bit of the data is input.

It may be determined whether the program confirmation command PGMe is input at step S709.

When it is determined that the program confirmation command PGMe is not input and the data DATA is input, may be determined whether to initialize cache latches of a next read/write circuit group (e.g., 40G1) at step S711. For example, it may be determined whether a difference between an address of the next read write circuit group 40G1 and the address, which is increased by the initialization control unit 21, is smaller than a predetermined value.

When the difference between the address of the next read/write circuit group 40G1 and the increased address is smaller than the predetermined value, the initialization control unit 21 may initialize cache latches of read/write circuits of the next group 40G1 at step S713. When the difference between the address of the next read/write circuit group 40G1 and the address, which is increased by the initialization control unit 21, is not smaller than the predetermined value, an initialization operation may not be performed on the cache latches, and the input of the data DATA and the increase of the address ADD may be continued at step S707. When the difference between the address of the read/write circuit group 40G2 and the increasing address is smaller than the predetermined value at step S711, even after the cache latches of the read/write circuit group 40G1 are reset, the initialization control unit 21 may initialize the cache latches of the read/write circuits of the next group 40G2 at step S713 then the input of the data DATA and the increase of the address ADD may be continued at step S707.

As described above, while steps S707, S709, S711 and S713 are repeated, if it is determined that the input of the data DATA is completed and the program confirmation command PGMe is input at step S709, the initialization control unit 21 may initialize cache latches of read/write circuit groups, which are not initialized, prior to a program operation at step S715.

The initialization control unit 21 may simultaneously or sequentially output the cache reset signals CRST<0:m> to initialize the cache latches of the read/write circuit groups that are not initialized. As a result, the cache latches of the read/write circuit groups, which are not initialized, may be simultaneously reset or sequentially reset by unit of group. Program-inhibit data may be input to the cache latches by the cache reset signals CRST<0:m>.

Subsequently, a program operation may be performed to store the data input to the cache latches of the read/write circuits PBs in the memory cells at step S717. When the number of bits of the input data is smaller than the number of cache latches, the program operation may be performed on some of the cache latches with the program-inhibit data input thereto through an initialization operation.

Therefore, a peak current may be relieved when a large number of latches are initialized to a program-inhibited state, and thus electrical characteristics and operating stability may be ensured by preventing a rapid increase in current consumption and initializing cache latches when a power voltage is stabilized.

Figure 8:
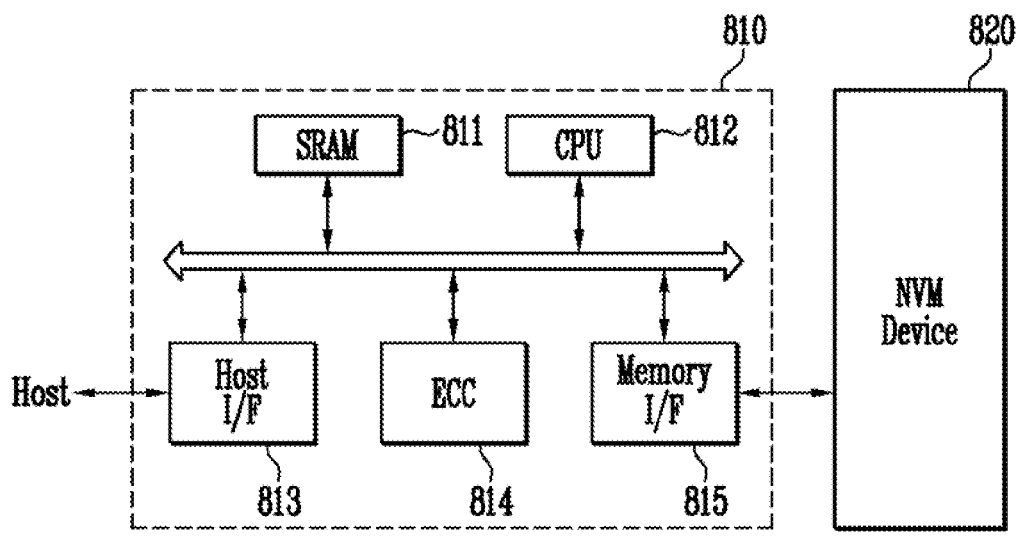
FIG. 8 is a block diagram of a memory system including a non-volatile memory device according to an embodiment of the present invention.

FIG. 8 is a block diagram illustrating a memory system 800 according to an embodiment of the present invention.

As illustrated in FIG. 8, the memory system 800 may include a non-volatile memory device (NVM device) 820 and a memory controller 810.

The non-volatile memory device 820 may include the above-described semiconductor device and operate in accordance with the above method. The memory controller 810 may control the non-volatile memory device 820. The memory system 800 having the above-described configuration may be a memory card or a solid-state disk (SSD) in which the non-volatile memory device 820 and the memory controller 810 are combined. SRAM 811 may function as an operation memory of a central processing unit (CPU) 812. A host interface (host I/F) 813 may include a data exchange protocol of a host coupled to the memory system 800. An error correction circuit (ECC) 814 may detect and correct errors included in a data read from the non-volatile memory device 820. A memory interface (memory I/F) 815 may interface with the non-volatile memory device 820. The CPU 812 may perform the general control operation for data exchange of the memory controller 810.

Though not illustrated in FIG. 8, the memory system 800 may further include ROM that stores code data to interface with the host. In addition, the non-volatile memory device 820 may be a multi-chip package composed of a plurality of flash memory chips. The memory system 800 may be provided as a storage medium having high reliability and low error rate. For example, when the memory system 800 is an SSD, the memory controller 110 may communicate with an external device (e.g., a host) through one of the interface protocols including a universal serial bus (USB), a multimedia card (MMC), a peripheral component interconnection (PCI), a PCI-express (PCI-E), a parallel advanced technology attachment (PATA), a serial ATA (SATA), an small computer system interface (SCSI), an enhanced small device interface (ESDI) and an integrated drive electronics (IDE).

Figure 9:
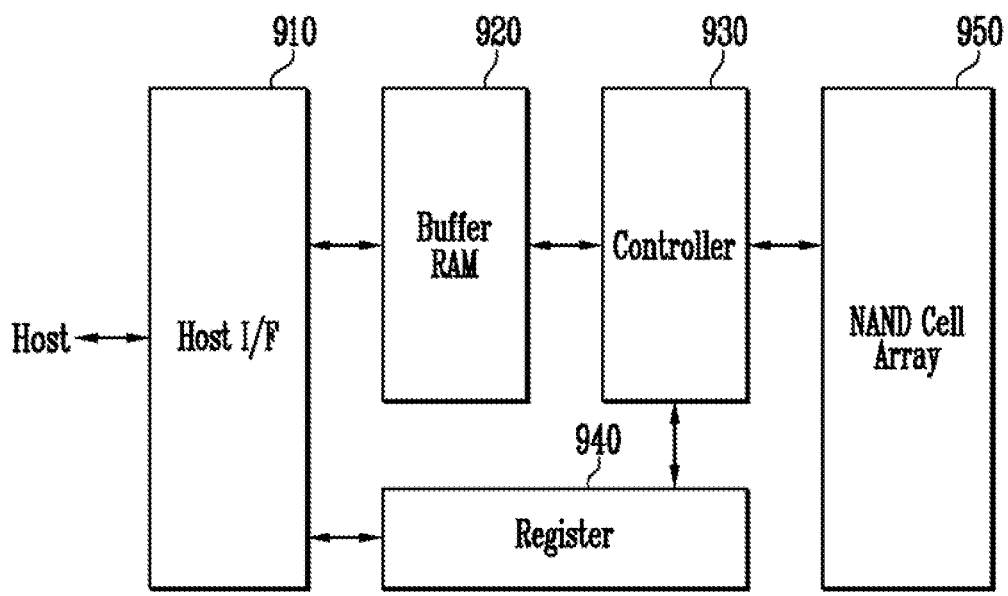
FIG. 9 is a block diagram illustrating a fusion memory device or a fusion memory system for performing an operation according to an embodiment of the present invention.

FIG. 9 is a block diagram illustrating a fusion memory device or a fusion memory system that performs an operation according to the aforementioned various embodiments. For example, technical features of the embodiment of the present invention may be applied to a OneNand flash memory device 900 as the fusion memory device.

The OneNand flash memory device 900 may include a host interface (I/F) 910, a buffer random access memory (RAM) 920, a controller 930, a register 940 and a NAND flash cell array 950. The host interface 910 may exchange various types of information with a device through a different protocol. The buffer RAM 920 may have built-in codes for driving the memory device or temporarily store data. The controller 930 may control read and program operations and every state in response to a control signal and a command that are externally given. The register 940 may store data including commands addresses and configurations for defining a system operating environment in the memory device. The NAND flash cell array 950 may include operating circuits including non-volatile memory cells and page buffers. The memory array shown in FIG. 2 may be used as the memory array of the NAND flash cell array 950.

Figure 10:
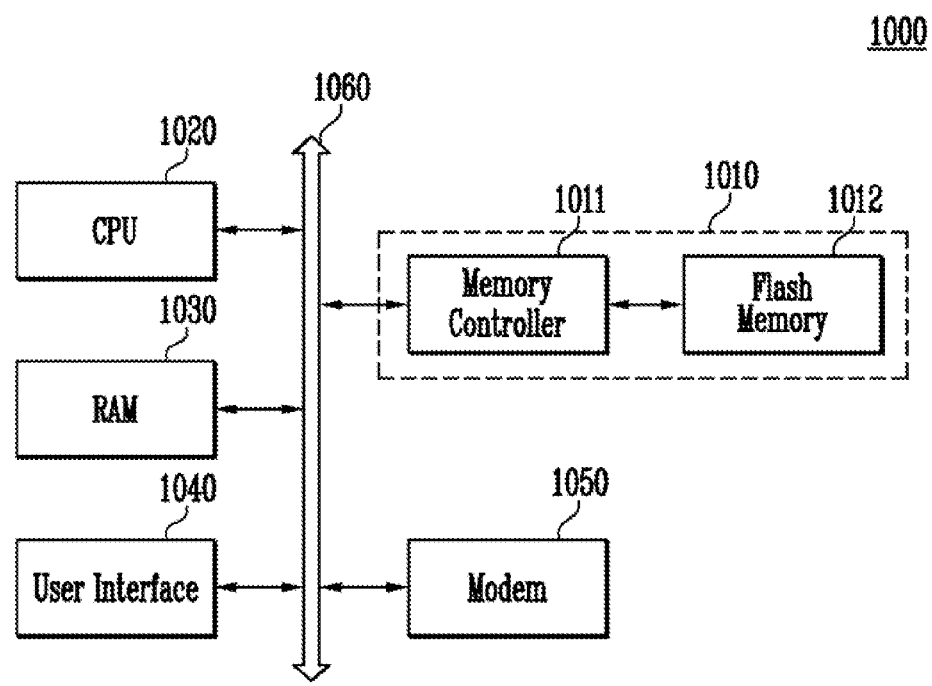
FIG. 10 is a block diagram illustrating a computing system including a flash memory device for performing an operation according to an embodiment of the present invention.

FIG. 10 is a block diagram illustrating a computing system 1000 including a flash memory device for performing an operation according to an embodiment of the present invention.

The computing system 1000 may include a microprocessor (e.g., a CPU) 1020, RAM 1030, a user interface 1040, a modem 1050, such as a baseband chipset, and memory system 1010 that are electrically coupled to a system bus 1060. In addition, if the computing system 1000 is a moble device, then a battery may be provided to apply operating voltages to the computing system 1000. Though not shown in FIG. 10, the computing system 1000 may further include application chipsets, a Camera Image Processor (CIP), or mobile DRAM. The memory system 1010 may form a SSD that uses a non-volatile memory to store data. The memory system 1010 may be provided as a fusion flash memory (e.g., OneNAND flash memory).

According to the embodiment of the present invention, electrical characteristics and operating stability may be ensured.

Although embodiments have been described with reference to a number of illustrative embodiments thereof, it should be understood that numerous other modifications and embodiments can be devised by those skilled in the art that will fall within the spirit and scope of the principles of this disclosure.

What is claimed is:

1. A semiconductor device, comprising:
   a memory block including memory cells coupled to bit lines;
   read/write circuits each including cache latch suitable for temporarily storing data to be stored in the memory cells, wherein the read/write circuits are divided into a plurality of groups and perform a program operation to store the data in the memory cells coupled to the bit lines; and
   an initialization control unit suitable for, initializing the cache latches of the read/write circuits of a group corresponding to the address before the data is input to the cache latches, when a program command and an address are input.

2. The semiconductor device of claim 1, wherein the initialization control unit increases the address while the data is input to the cache latches of the read/write circuits after the address is input.

3. The semiconductor device of claim wherein the Initialization control unit increases the address until the data is input to all the cache latches.

4. The semiconductor device of claim 2, wherein, when a difference between an address of a next group of the read/write circuits and the address, which is increased, is smaller than a predetermined value, the initialization control unit initializes the cache latches of the read/write circuits of the next group.

5. The semiconductor device of claim 1, wherein the initialization control unit initializes remaining cache latches of the read/write circuits, which are not initialized, when a program confirmation command is input after the data is input.

6. The semiconductor device of claim 5, wherein the initialization control unit initializes the remaining cache latches of the read/write circuits, which are not initialized, before the program operation is performed.

7. The semiconductor device of claim 5, wherein the initialization control unit simultaneously initializes the remaining cache latches of the read/write circuits, which are not initialized, or sequentially initializes the cache latches by unit of group.

8. The semiconductor device of claim 5, wherein the initialization control unit sequentially initializes the remaining cache latches, which are not initialized, of the read/write circuits by unit of group.

9. The semiconductor device of claim 1, wherein the memory block includes a plurality of IO blocks, and
the initialization control unit simultaneously initializes the cache latches of the read/write circuits of groups corresponding to the address by the IO blocks.

10. The semiconductor device of claim 1, wherein the initialization control unit outputs a cache reset signal to the cache latches of the read/write circuits to initialize the cache latches so that program inhibit data is input to the cache latches.

11. The semiconductor device of claim 1, wherein the initialization control unit comprises:
a pulse generation unit suitable for generating a start pulse when the program command and the address are input, and for generating an end pulse when the program confirmation command is input;
an address counter suitable for increasing the address while the data is input after the address is input; and
a latch control unit suitable for outputting a cache reset signal to initialize cache latches of a group selected based on an address, which is output from the address counter, when the start pulse is input, and for outputting the cache reset signals to initialize remaining cache latches, which are not initialized, when the end pulse is input.

12. The semiconductor device of claim 1, wherein the memory cells each include a NAND flash cell.

13. A method of operating a semiconductor device, the method comprising:
initializing cache latches of read/write circuits of a group corresponding to the address, when a program command and an address are input;
inputting data to the initialized cache latches;
initializing remaining cache latches, which are not initialized, when a program confirmation command is input; and
performing a program operation to store the data in memory cells.

14. The method of claim 13, further comprising increasing the address while data is input to the cache latches after the address is input.

15. The method of claim 14, wherein the address is increased until the data is input to all the cache latches.

16. The method of claim 14, further comprising initializing the cache latches of the read/write circuits of a next group when a difference between an address of the next group of the read/write circuits and the address, which is increased, is smaller than a predetermined value.

17. The method of claim 13, wherein the remaining cache latches, which are not initialized, are simultaneously initialized when the program confirmation command is input after the data is input to all the cache latches.

18. The method of claim 13, wherein the remaining cache latches, which are not initialized, sequentially initialized by unit of group when the program confirmation command is input after the data is input to all the cache latches.

19. The method of claim 13, wherein program-inhibit data is input to the initialized cache latches.

20. The method of claim 13, wherein each of the memory cells include a NAND flash cell.

* * * * *